(12) United States Patent  
Haase et al.

(10) Patent No.: US 8,765,611 B2  
(45) Date of Patent: Jul. 1, 2014

(54) ETCHING PROCESS FOR SEMICONDUCTORS

(75) Inventors: Michael A. Haase, St. Paul, MN (US); Terry L. Smith, Roseville, MN (US); Jun-Ying Zhang, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 911 days.

(21) Appl. No.: 12/917,826

(22) Filed: Nov. 2, 2010

(65) Prior Publication Data  
US 2011/0108956 A1  May 12, 2011

Related U.S. Application Data

(60) Provisional application No. 61/259,299, filed on Nov. 9, 2009.

(51) Int. Cl.  
*H01L 21/027* (2006.01)

(52) U.S. Cl.  
USPC ............. 438/718; 257/E21.023; 257/E33.019

(58) Field of Classification Search  
USPC ................. 438/706–711, 713–718, 726–736; 257/E21.024, E33.019, E21.023  
See application file for complete search history.

(56) References Cited

U.S. PATENT DOCUMENTS

| 5,356,478 A * | 10/1994 | Chen et al. .................... 134/1 |
| 5,404,027 A | 4/1995 | Haase et al. |
| 5,501,893 A | 3/1996 | Laermer et al. |
| 5,538,918 A | 7/1996 | Haase et al. |
| 6,054,391 A | 4/2000 | Nam et al. |
| 6,284,148 B1 | 9/2001 | Laermer et al. |
| 6,347,874 B1 | 2/2002 | Boyd et al. |
| 6,352,081 B1 * | 3/2002 | Lu et al. .................... 134/22.1 |
| 6,379,016 B1 | 4/2002 | Boyd et al. |
| 6,495,455 B2 | 12/2002 | Vassalli et al. |
| 6,720,268 B1 | 4/2004 | Laermer et al. |
| 6,933,242 B1 * | 8/2005 | Srinivasan et al. ............ 438/714 |
| 7,402,831 B2 | 7/2008 | Miller et al. |
| 2005/0093098 A1 | 5/2005 | Hirose et al. |
| 2006/0141794 A1 | 6/2006 | Laermer et al. |
| 2008/0050854 A1 | 2/2008 | Sugawara et al. |
| 2008/0050922 A1 | 2/2008 | Tang et al. |
| 2009/0015757 A1 | 1/2009 | Potts et al. |
| 2012/0097921 A1 * | 4/2012 | Smith et al. ..................... 257/13 |

FOREIGN PATENT DOCUMENTS

| EP | 0774772 | 5/1997 |
| JP | 2005353972 | 12/2005 |
| WO | WO 2008/083188 | 7/2008 |
| WO | WO 2009/085660 | 7/2009 |

OTHER PUBLICATIONS

Peter Van Zant; Microchip Fabrication : A Practical Guide to Semiconductor Processing; Year 2000; McGraw-Hill; 4th edition; pp. 210,259,265-268.*

(Continued)

*Primary Examiner* — Marcos D. Pizarro  
(74) *Attorney, Agent, or Firm* — Steven E. Skolnick

(57) ABSTRACT

A process for etching semiconductors, such as II-VI or III-V semiconductors is provided. The method includes sputter etching the semiconductor through an etching mask using a nonreactive gas, removing the semiconductor and cleaning the chamber with a reactive gas. The etching mask includes a photoresist. Using this method, light-emitting diodes with light extracting elements or nano/micro-structures etched into the semiconductor material can be fabricated.

16 Claims, 4 Drawing Sheets

(56) References Cited

OTHER PUBLICATIONS

International Search Report, PCT/US2010/055096, mailed Jun. 3, 2011, 3 pages.
Written Opinion of the International Searching Authority, PCT/US2010/055096, Mailed Jun. 3, 2011, 5 pages.
U.S. Appl. No. 61/259,289; Inventor Smith et al.; filed Nov. 9, 2009.
Bacher, "Deep Etched ZnSe-Based Nanostructures for Future Optoelectronic Applications", *Phys. Stat. Sol. (b)*, vol. 187, pp. 371-377, (1995).
Eisert, "Wavelength Control in II-VI Laser Diodes with First Order Distributed Bragg Reflectors", *App. Phys. Lett.*, vol. 71, No. 8, pp. 1026-1028, (Aug. 1997).
Haase, "Low-threshold Buried-ridge II-VI Laser Diodes", *Appl. Phys. Lett.*, vol. 63, No. 17, pp. 2315-2317 (Oct. 1993).
Lee, "Investigation of Masking Materials for High-Ion-Density $Cl_2$/Ar Plasma Etching of GaAs", *Semicond. Sci. Technol.*, vol. 11, pp. 812-815, (1996).
Srivastav, "Overview of Etching Technologies Used for HgCdTe", *Opto-Electronics Rev.*, vol. 13, No. 3, pp. 197-211, (2005).
Stoltz, "Comparing ICP and ECR Etching of HgCdTe, CdZnTe, and CdTe", *Journal of Electronic Materials*, vol. 36, No. 8, pp. 1007-1012, (2007).
Sugata, "Characterization of Damage on GaAs in a Reactive Ion Beam Etching System Using Schottky Diodes", *J. Vac. Sci. Technol. B*, vol. 6, No. 3, pp. 876-879, (May/Jun. 1988).

* cited by examiner

ETCHING PROCESS FOR SEMICONDUCTORS

CROSS REFERENCE TO RELATED APPLICATION

This application claims the benefit of U.S. Provisional Patent Application No. 61/259,299, filed Nov. 9, 2009, the disclosure of which is incorporated by reference herein in its entirety.

FIELD

This disclosure broadly relates to a process for etching semiconductors.

BACKGROUND

The rapid development of optoelectronics has produced a need for methods of producing nanometer-sized patterns on semiconductor surfaces. Typically, these patterns are etched into semiconductor substrates by a number of techniques. For example, wet chemical etching has been used to etch a wide variety of semiconductors. However, wet chemical etching can be isotropic, thereby limiting the aspect ratio of features that can be fabricated, and the uniformity of the process is low. Production industries in the optoelectronics industries require more controlled etching procedures than can be achieved using wet etching.

As a result of the shortcomings of wet chemical etching, dry etching processes have been developed for semiconductors. For example, reactive ion etching has been used to produce well-controlled etching profiles in silicon substrates. Reactive ion etching involves generating chemically reactive species, such as radicals and ions, via an electric discharge in a low pressure reactive gas mixture in a reactor. The reactive species generated in this manner are accelerated towards a substrate by means of an electrical field and react with the silicon to produce volatile reaction product which are pumped away. An etch mask can be applied to the substrate prior to etching to allow the reactive species to etch a pattern into the substrate. Because of the nearly vertical fall of the positively-charged reactive species, etching is much slower on the side-walls of the etched features as the etching progresses into the substrate.

Hard etch masks that are made of, for example, $SiO_2$, $Si_3N_4$, or metals are well known to those of ordinary skill in the art of semiconductor photolithography. But these masks are difficult to fabricate since they typically need to be vacuum deposited in a separate step before the photoresist is applied. Hard etch masks make the process more complicated and add more process steps. Additionally, after etching the hard masks need to be removed by dry etching or wet etching. Furthermore, with many etching chemistries, these materials tend to etch at a rate that is close to that of many II-VI or III-V semiconductors which makes their use limited. While reactive-ion etching is very useful for semiconductors, such as silicon, that form volatile byproducts which can be easily eliminated from a vacuum chamber via pumping, reactive-ion etching is not very practical for II-VI semiconductors since these materials do not easily react with reactive-ions and typically do not form volatile byproducts. Dry etching is well-established for patterning most semiconductor materials. Chlorine ($Cl_2$) based reactive ion etching (RIE) is widely used in dry etching of III-V and II-VI semiconductors for fabricating various optoelectronic devices and detectors. Other gas systems, including $Cl_2/Ar$, $Cl_2/N_2$, $Cl_2/He$, $Cl_2/BCl_3/Ar$, $BCl_3/Ar$, $BrCl_3$, $SiCl_4/Ar$, $CCl_2F_2/H_2/Ar$, etc., have also been investigated. However, these reactants and their products are known to be corrosive and toxic. Also, rapid post-etching degradation has been observed when Cl-based RIE is used, due to the corrosion by persistent $Cl_2$ residues. In the specific case of cadmium-containing semiconductors, cadmium halides have vapor pressures which are several orders of magnitude too low to provide the basis for useful etching. In the absence of cadmium volatility, the most likely result is the formation of a cadmium-rich material on the surface of the semiconductor. Therefore, $CH_4/H_2$ and $CH_4/H_2/Ar$ based chemistries have been developed and are favored for plasma etching of Cd-containing semiconductors. However, these processes suffer from several drawbacks including extensive polymer deposition, which acts as an etch stop mechanism, rough surfaces, and low etch rates (less than 50 nm/min).

SUMMARY

A method for etching II-VI or III-V semiconductors is needed that can etch these substrates rapidly, efficiently, selectively, and economically. A method for etching II-VI or III-V semiconductors is needed that can be used to pattern optoelectronic devices, such as, for example, light-emitting diodes (LEDs) that include such semiconductors. Additionally, a method is needed for producing optoelectronic devices such as light-emitting diodes that include light extracting elements or defined pixels.

A method is provided for etching a semiconductor that includes providing a semiconductor having an etching mask thereon in a vacuum chamber and sputter etching the semiconductor through the etching mask with a nonreactive etching gas to remove material from the surface of the semiconductor and to provide at least one etched surface, removing the semiconductor with at least one etched surface from the vacuum chamber; and cleaning the vacuum chamber wherein the semiconductor comprises a III-V semiconductor, a II-VI semiconductor, or a combination thereof. The semiconductor can include a III-V semiconductor, a II-VI semiconductor, or a combination thereof. The provided method can be useful for II-VI semiconductors that can include, but are not limited to, cadmium, magnesium, zinc, sulfur, selenium, tellurium, or combinations thereof. The provided method can also be useful for III-V semiconductors that can include, but are not limited to, aluminum, gallium, indium, arsenic, phosphorus, nitrogen, antimony, or combinations thereof. The nonreactive etching gas can include, but is not limited to, argon, krypton, xenon, helium, neon, nitrogen, or combinations thereof. The provided method includes cleaning the vacuum chamber with a reactive gas.

In this disclosure:

"extraction elements" refers to any type and arrangement of nano/microstructures enhancing light extraction from self-emissive light sources such as light-emitting diodes;

"nonreactive gas" refers to a gas that can be used to etch a substrate by physical sputtering. Sputter etching occurs primarily through physical bombardment of the surface with energetic species, which can displace or expel surface atoms via kinetic energy transfer; the active species do not substantially react with a substrate and the ejected material is typically non-volatile;

"reactive ion etching" refers to the process of ionizing a reactive gas in a plasma discharge and accelerating it towards a substrate where the reactive species can chemically react with the substrate to form volatile species; and "sputter etching" refers to the bombardment of a substrate with ions so as to remove material from the substrate by transfer of momentum from the ions to the material on the substrate; it is differentiated from reactive ion etching in that the species in the etching gas physically remove substrate material by momentum transfer.

The provided method and structures made by the provided method can etch semiconductors, such as II-VI and III-V semiconductors. The provided method is a method that can rapidly, efficiently, selectively, and economically etch these materials and can provide optoelectronic devices, such as light-emitting diodes, that have structures, such as extraction elements, thereon.

The above summary is not intended to describe each disclosed embodiment of every implementation of the present invention. The brief description of the drawings and the detailed description which follows more particularly exemplify illustrative embodiments.

DETAILED DESCRIPTION

Figure 1A:
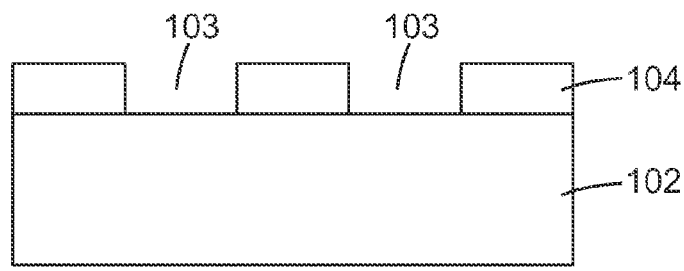
FIGS. 1a-1b are side-view schematic drawings of steps in the provided process.

In the following description, reference is made to the accompanying set of drawings that form a part of the description hereof and in which are shown by way of illustration several specific embodiments. It is to be understood that other embodiments are contemplated and may be made without departing from the scope or spirit of the present invention. The following detailed description, therefore, is not to be taken in a limiting sense.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

The provided process can use conventional etching equipment and can thus obviate the need for special equipment. The provided process uses sputter etching instead of reactive-ion etching, and is thus useful on semiconductors that are not reactive with reactive-ions, for example, semiconductors made from non-silicon materials. In some embodiments, these semiconductors include, for example, III-V semiconductors such as, for example, GaAs, InP, AlGaAs, GaInAsP, or GaInNAs. In other embodiments the provided process is useful for etching II-VI semiconductors such as, for example, materials that can include cadmium, magnesium, zinc, sulfur, selenium, tellurium, and combinations thereof. An exemplary II-VI semiconductor material can include CdMgZnSe alloy. Other II-VI semiconductors such as CdZnSe, ZnSSe, ZnMgSSe, ZnS, CdS, ZnSe, ZnTe, ZnSeTe, HgCdSe, and HgCdTe can also be etched using the provided process.

The provided process relates to a method of sputter etching a semiconductor. The semiconductor is provided with an etching mask thereon that resists etching and thereby defines the part of the semiconductor surface that is etched. Typical etching masks can be made of hard materials such as $SiO_2$, $Si_3N_4$, and metals such as titanium or tungsten. However, masks made of these hard materials are somewhat time-consuming to fabricate (since they must be deposited and then patterned using photoresist) and they can be etched by sputter etching, sometimes at rates similar to that of the rate of etching the semiconductor. Photoresists alone can also be useful as etching masks. Photoresist etching masks can include positive photoresists comprised of a polymer that becomes soluble in a basic developer upon exposure to radiation, and negative photoresists that cross-link and become insoluble upon exposure to radiation. Exemplary positive photoresists include UV5 photoresist and Shipley 1813 photoresist (both available from Rohm and Hass Electronic Materials, Marlborough, Mass.). Exemplary negative photoresists include UVN 30 (available from Rohm and Haas Electronic Materials), and FUTURREX negative photoresists, such as NR9-1000P and NR9-3000PY (available from Futurrex, Franklin, N.J.). Photoresists are well known to those of ordinary skill in the art of semiconductor lithography. A process for sputter etching II-VI or III-V semiconductors using a photoresist etching mask is described in copending application Ser. No. 61/259,289, filed on the same day herewith.

The semiconductor material can be sputter etched in areas not blocked by the etching mask by bombardment of the semiconductor surface with ions of a nonreactive etching gas. The etching gas ions can remove or eject material (byproducts) from an exposed surface of the semiconductor. The etching typically occurs on surfaces of the semiconductor that are not protected by the etching mask. The etching mask can have patterned openings that, for example, define image pixels or provide patterns for producing light extractors on the surface of the semiconductor material. The nonreactive etching gas ions can impinge on the surface of the semiconductor material in a substantially vertical manner. That is, the etchant ions can be configured to strike the surface of the semiconductor material in essentially a straight line—typically at or near right angles to the surface of the semiconductor material. The etchant can remove or expel exposed molecules from the semiconductor material by transfer of kinetic energy.

Exemplary nonreactive etching gases (etchants) can include argon, krypton, xenon, nitrogen, or combinations thereof. These gases have little or no tendency to react with semiconductor material since they are substantially inert gases. Thus, they tend to etch by physical bombardment, transferring momentum to the molecules on the exposed surface of the semiconductor material. This material then can be ejected and deposit on other previously etched surfaces, such as the etched vertical surface of the semiconductor wall. Alternatively, the ejected material can deposit elsewhere in the vacuum chamber as debris. The debris can build up and eventually contaminate the etching process. It is typically removed periodically by cleaning the vacuum chamber.

It has been found, surprisingly, that etching masks made from photoresist can have high selectivity towards sputter etching compared to II-VI or III-V semiconductors when both are subjected to sputter etching with a nonreactive gas such as, for example, argon. For example, when the photoresist is a negative photoresist, such as NR9-1000P or NR9-3000PY (available from Futurrex, Franklin, N.J.), and the semiconductor is a II-VI semiconductor such as CdMgZnSe, the semiconductor has been found to etch at a rate of from 6 to 12 times faster than the photoresist. In some embodiments of the provided process, the semiconductor can be etched at a rate of greater than about 100 nm/min, greater than about 300 nm/min, greater than about 500 nm/min, or even greater than about 1000 nm/min. In some embodiments, the photoresist etching mask can be etched at a rate of less than about 100 nm/min, less than about 50 nm/min, or even less than about 25 nm/min. In some embodiments, the ratio of the semiconductor etch rate to the photoresist etch rate is greater than about 3, greater than about 6, greater than about 10, or even greater than about 12.

Figure 1B:
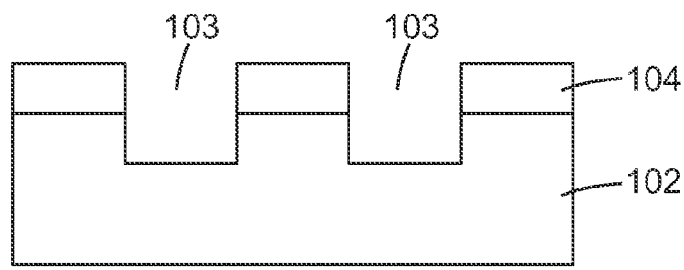

The provided method can be better understood by references to the drawings. FIGS. 1a-1b are side-view schematic drawings of steps in the provided method. FIG. 1a is a drawing that includes semiconductor material 102 with patterned photoresist 104 disposed thereon. Patterned photoresist 104 has trenches 103 that expose portions of semiconductor material 102. Sputter etching of semiconductor material 102 is performed using a nonreactive gas. FIG. 1b shows that after sputter etching, trench 103 has been extended so that a portion of exposed semiconductor material 102 that is not covered by photoresist 104 has been etched below the original surface of semiconductor material 102.

The provided method of anisotropic etching of semiconductors can be used to form etched features, such as, for example, light extraction elements, into semiconductors. In some embodiments, the provided method can be used to etch extraction elements that define small pixels in displays on electronic devices made using II-VI semiconductors. These pixels can be very small. For example, the pixels can have a longest dimension of less than about 10 micrometers. The pixels can be separated by trenches that are about 1 micron. Such exemplary devices include down-converted light-emitting diodes (LEDs). In other embodiments, the provided method can be used to form light extractors on the face of LEDs made from II-VI semiconductors. Such light extractors can increase the amount of light emitted from the LED face. Exemplary light extraction elements are not limited to any types of structures. In some embodiments, light extraction elements can include diffracting or scattering nanostructures as disclosed, for example, in U.S. Pat. Publ. No. 2009/0015757 (Potts et al.); structures with risers as disclosed, for example, in U.S. Pat. Nos. 6,347,874 and 6,379,016 (both Boyd et al.); and structures such as those disclosed in PCT Pat. Publ. No. WO 2008/083188 (Lu et al.). In some embodiments, the light extraction elements can have dimensions as small as about 500 nm.

Typically, argon gas is used as the nonreactive etching gas since it tends to effectively etch II-VI or III-V semiconductors without degrading the semiconductor properties as much as do gases that etch by reactive-ion interaction such as, for example, chlorine gas. However, as described above, unwanted debris can be produced by sputtering of semiconductors. These debris can deposit on the interior surfaces of the plasma etching system, and thereby change the electrical properties of the system, resulting in an unstable etch rate. Debris can also potentially re-deposit on the sample. Thus, when using a nonreactive etching gas, it is desirable to periodically remove the semiconductor from the vacuum chamber, fill the chamber with a reactive gas, such as, for example, chlorine, oxygen, or a combination thereof to react with and volatilize the debris that have accumulated inside of the vacuum chamber. A wide variety of reactive gases and combinations of reactive gases can be used to clean the chamber. These include, for example, chlorine, oxygen, boron trichloride, silicon tetrachloride, and hydrogen. Typically these reactive gases can be mixed with a nonreactive gas such as argon, helium, or nitrogen.

In cases in which it is desired to sputter etch the semiconductor to a greater depth, it may be advantageous to sputter etch the sample to a fraction of the target depth, remove the sample from the chamber, clean the chamber, and then return the sample to the chamber for further etching. This etch-and-clean cycle may be repeated to reach any desired etch depth.

Objects and advantages of this invention are further illustrated by the following examples, but the particular materials and amounts thereof recited in these examples, as well as other conditions and details, should not be construed to unduly limit this invention.

EXAMPLES

Figure 2:
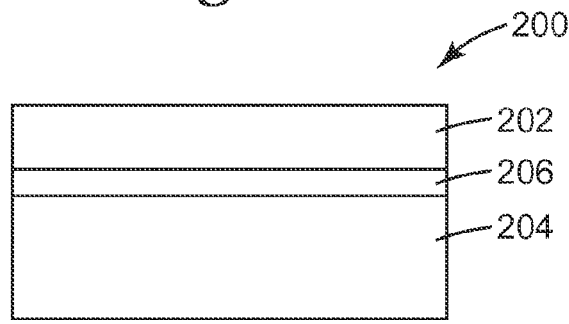
FIG. 2 is a side-view schematic drawing of an exemplary semiconductor construction useful in the provided process.

A II-VI semiconductor color converter layer structure based upon CdMgZnSe alloy was grown by molecular beam epitaxy on an InP substrate. The color converter layer structure is shown schematically in FIG. 2, and the layer thicknesses and compositions are shown in Table I below. FIG. 2 is a schematic of color converter layer 200 that includes top window 202, absorber 204, and a graded compositional layer 206 that gradually changes from the composition of top window 202 to absorber 204. Embedded in the absorber layer (not shown) are quantum wells that capture carriers generated when pump light is absorbed in the absorber layer and re-emit light at a longer wavelength. Details of color converter structures may be found, for example, in U.S. Pat. No. 7,402,831 (Miller et al.).

TABLE I

Composition of Color Converter Layer Structure

| Layer | Parts Cd | Parts Mg | Parts Zn | Parts Se | Thickness (μm) |
|---|---|---|---|---|---|
| Top Window | 0.15 | 0.55 | 0.30 | 1.00 | 0.50 |
| Grading Layer | 0.15-0.29 | 0.55-0.34 | 0.30-0.37 | 1.00 | 0.25 |
| Absorber | 0.29 | 0.34 | 0.37 | 1.00 | 1.50 |

Comparative Example 1

$Cl_2$ Reactive Ion Etching of a II-VI Semiconductor

A photoresist pattern of ridges was created on the II-VI semiconductor structure described above using a negative photoresist (NR1-1000P, available from Futurrex, Franklin, N.J.) and conventional contact lithography. The sample was then cleaved into small pieces for etching as described in the following examples. The etching was conducted in a commercial reactive ion system (RIE, Model PLASMA LAB System 100, available from Oxford Instruments, Yatton, UK).

A small cleaved sample of the II-VI semiconductor with the photoresist mask thereon was put on a Si carrier wafer, loaded into the RIE chamber, and plasma etched using 80 sccm $Cl_2$, 5 sccm Ar, 75-200 Watts Radio Frequency (RF) power, 1200 Watts inductively coupled plasma power, at a pressure of 6 mTorr and an etch time of 4×30 second intervals. The photoresist was severely damaged by the $Cl_2$ plasma etching. The etching rate of the photoresist was measured as 1000 nm/min. The ratio of the etching rate of the semiconductor to that of the photoresist was 0.19. Thus, the reactive species produced by chlorine reacts with the photoresist and etches the photoresist much more rapidly than it does the II-VI semiconductor.

Example 1

Ar Etching of II-VI Semiconductor with a Photoresist Mask

Figure 3:
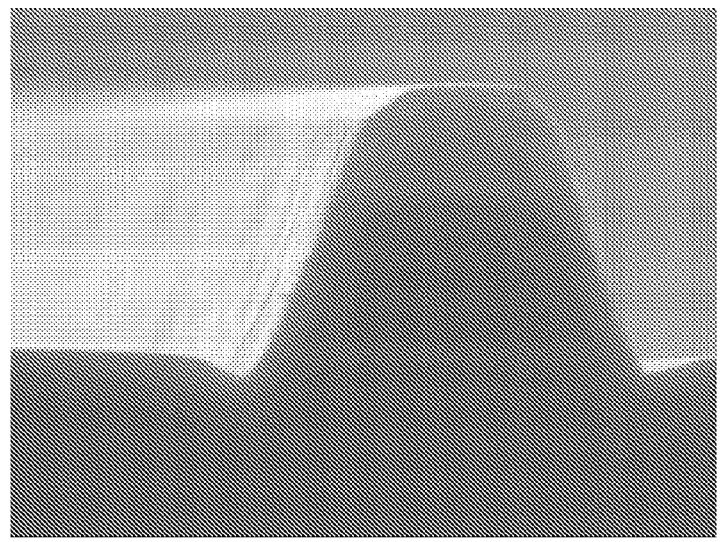
FIG. 3 is a scanning electron photomicrograph of the etched semiconductor produced in Example 1.

A sample of the II-VI semiconductor color converter described above was overcoated with a photoresist mask with stripe patterns using NR9-1000P negative photoresist, available from Futerrex, Franklin, N.J. The stripe patterns had dimensions of 2 μm and 100 μm. A small cleaved sample of the II-VI semiconductor with the photoresist mask thereon was put on a Si carrier wafer, loaded into the RIE chamber, and plasma etched using 5-50 sccm Ar, 20-200 Watts Rf power, 700-2000 Watts inductively coupled plasma power (ICP), at a pressure of 4-30 mTorr and an etch time of 5×60 second intervals. Pixel stripes having widths as small as 2 μm continued to exhibit strong photoluminescence for several months after processing. An identical sample etched with $Cl_2$ under identical conditions as those in Comparative Example 1 except that the etch time was 6×30 second intervals (to allow for cooling of the substrate during the intervals) showed rapid degradation of photoluminescence after one day. FIG. 3 is a photomicrograph of the semiconductor etched using the argon sputter etching process. The etch profile that was obtained had about a 63 degree wall angle. The ratio of the etching rate of the semiconductor to the photoresist varied from about 6 to about 12 and could be controlled by changing the RF power. Lower RF power increased the ratio but decreased the speed of etching. The etch rate of the II-VI semiconductor color convertor ranged from 300 nm/min to 500 nm/min.

Example 2

Ar Etching of 3 Micrometer Trenches in II-VI Semiconductor Material

Figure 4A:
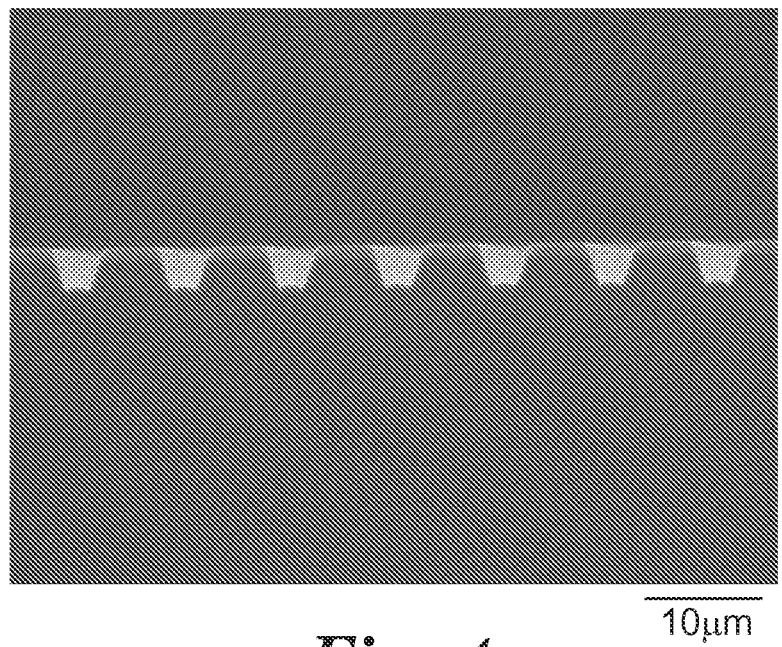
FIG. 4a is a scanning electron photomicrograph of the etched semiconductor produced in Example 2.
Figure 4B:
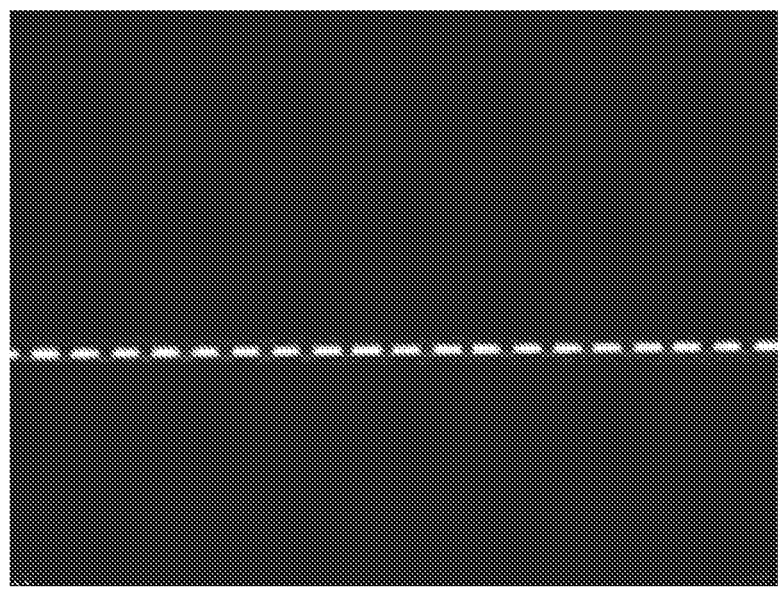
FIG. 4b is a dark field optical photomicrograph of the etched semiconductor produced in Example 2.

A patterned photoresist upon on a II-VI semiconductor color converter structure as described above in Table 1 was made by optical lithography with NR9-3000PY negative photoresist available from, available from Futurrex, Franklin, N.J.) was etched using the procedure of Example 1. FIG. 4a is a scanning electron photomicrograph of the resultant structure and shows a pattern of trenches 3 μm wide leaving ridges approximately 6 μm across. FIG. 4b is a dark field optical photomicrograph showing photoluminescence of the semiconductor ridges. What is observed is a series of emitting "pixels" where the semiconductor color converter has been left intact (protected during etching by the photoresist).

Example 3

Ar Plasma Etching of II-VI Semiconductor for Light Extraction

Figure 5A:
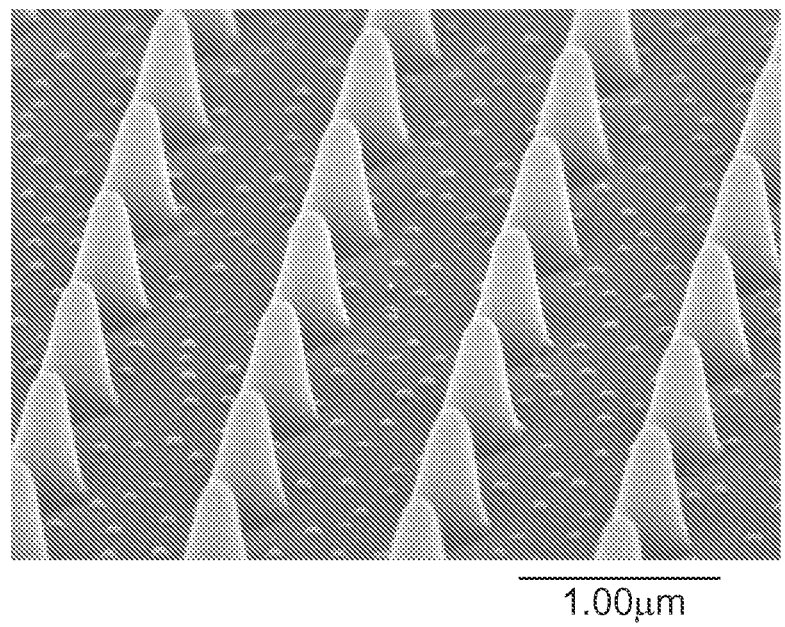
FIG. 5a is a scanning electron photomicrograph of photoresist patterns used in Example 3.
Figure 5B:
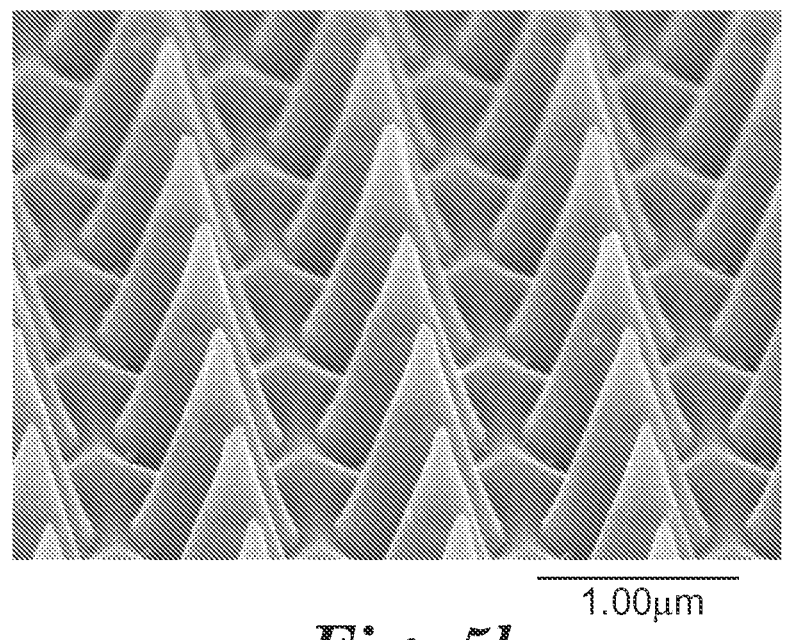
FIGS. 5b and 5c are scanning electron photomicrographs of etched semiconductors produced in Example 3.
Figure 5C:
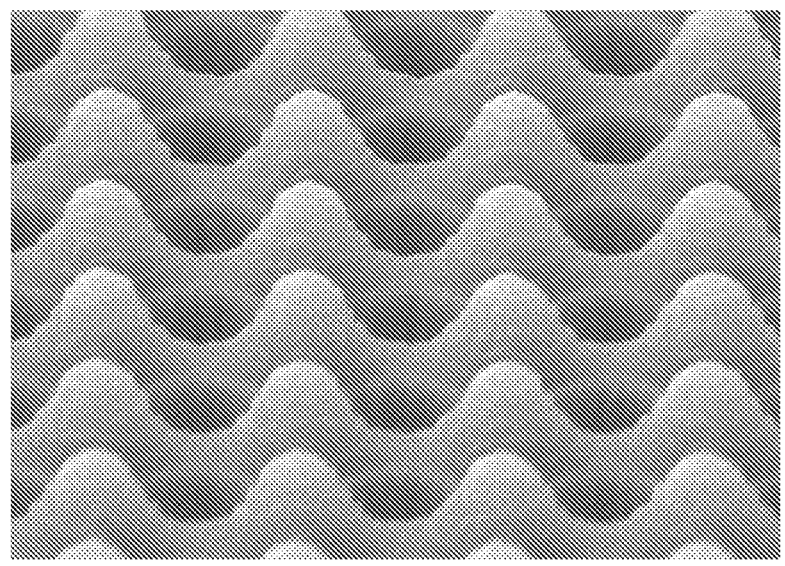

A patterned photoresist upon on a II-VI semiconductor color converter structure as described above in Table 1 was made as follows. 2-dimensional grating patterns with holes or post structures for light extraction were created in TELR-P003PM photoresist (available from Shipley, Marlborough, Mass.) using interference lithography based upon a laser diode source. The grating had 400-500 nm features on a 1 μm pitch. The patterned photoresist-coated semiconductor was subjected to Ar etching under conditions similar to those described in Example 1. FIG. 5a is a scanning electron micrograph of the photoresist pattern with post structures 400 nm in diameter on the semiconductor before etching. FIG. 5b shows the same view as FIG. 5a after Ar plasma etching, with the photoresist still in place. After etching, the remaining photoresist was pyramidal in structure and the semiconductor around the photoresist had been etched leaving conical posts under the resist (the boundary between the residual photoresist and the semiconductor can be seen in FIG. 5b, roughly two-thirds of the way from the base to the vertex of the conical structure). Further Ar etching yielded the pattern in the semiconductor shown in FIG. 5c. Photoluminescence measurements showed an external quantum efficiency of 50.4% for the etched sample illustrated in FIG. 5c. Photoluminescence measurements of the planar sample before etching showed an external quantum efficiency of 29.7%. This example shows how light extraction structures on a II-VI semiconductor increase the yield of the light that is emitted.

Various modifications and alterations to this invention will become apparent to those skilled in the art without departing from the scope and spirit of this invention. It should be understood that this invention is not intended to be unduly limited by the illustrative embodiments and examples set forth herein and that such examples and embodiments are presented by way of example only with the scope of the invention intended to be limited only by the claims set forth herein as follows. All references cited in this disclosure are herein incorporated by reference in their entirety.

What is claimed is:

1. A method of etching a semiconductor comprising:
providing a semiconductor having an etching mask thereon in a vacuum chamber, and
sputter etching the semiconductor through the etching mask with a nonreactive etching gas to remove material from the surface of the semiconductor and to provide at least one etched surface,
removing the semiconductor with at least one etched surface from the vacuum chamber; and
cleaning the vacuum chamber,
wherein the semiconductor comprises a III-V semiconductor, a II-VI semiconductor, or a combination thereof, and
wherein cleaning the vacuum chamber comprises introducing a reactive gas into the vacuum chamber and forming a plasma with the reactive gas to volatilize deposits of semiconductor material inside the vacuum chamber.

2. A method according to claim 1, wherein the etching mask comprises a negative photoresist.

3. A method according to claim 1, wherein the photoresist is etched at a rate of less than about 50 nm/min.

4. A method according to claim 1, wherein the reactive gas comprises chlorine.

5. A method according to claim 1, further comprising:
returning the semiconductor with at least one etched surface to the vacuum chamber after cleaning the chamber; and
further sputter etching the semiconductor through the etching mask with a nonreactive etching gas.

6. A method according to claim 1, wherein the nonreactive etching gas comprises argon, krypton, xenon, nitrogen, helium, neon or combinations thereof.

7. A method according to claim 6, wherein the nonreactive etching gas comprises argon.

8. A method according to claim 1, wherein the semiconductor is etched at rate of greater than about 300 nm/min.

9. A method according to claim 8, wherein the semiconductor is etched at a rate of greater than about 500 nm/min.

10. A method according to claim 1, wherein the ratio of the semiconductor etch rate to the photoresist etch rate is greater than about 6.

11. A method according to claim 10, wherein the ratio of the semiconductor etch rate to the photoresist etch rate is greater than about 10.

12. An etched semiconductor made according to claim 1.

13. An optoelectronic device comprising an etched semiconductor according to claim 12.

14. A method according to claim 1, wherein the semiconductor comprises a II-VI semiconductor.

15. A method according to claim 14, wherein the II-VI semiconductor comprises cadmium, magnesium, zinc, selenium, tellurium, or combinations thereof.

16. A method according to claim 15, wherein the semiconductor comprises a CdMgZnSe alloy.

* * * * *

UNITED STATES PATENT AND TRADEMARK OFFICE
CERTIFICATE OF CORRECTION

| | |
|---|---|
| PATENT NO. | : 8,765,611 B2 |
| APPLICATION NO. | : 12/917826 |
| DATED | : July 1, 2014 |
| INVENTOR(S) | : Michael Haase |

It is certified that error appears in the above-identified patent and that said Letters Patent is hereby corrected as shown below:

In the Claims:

Column 8,
Line 35, in Claim 1, delete "chamber," and insert -- chamber; --, therefor.

Column 9,
Line 10, in Claim 13, delete "optoclectronic" and insert -- optoelectronic --, therefor.

Signed and Sealed this
Fourth Day of November, 2014

Michelle K. Lee
*Deputy Director of the United States Patent and Trademark Office*